United States Patent
Jalan et al.

(10) Patent No.: US 10,886,033 B2
(45) Date of Patent: Jan. 5, 2021

(54) CONDUCTIVE FILMS

(71) Applicant: Regents of the University of Minnesota, Minneapolis, MN (US)

(72) Inventors: Bharat Jalan, Minneapolis, MN (US); Abhinav Prakash, Minneapolis, MN (US); Tianqi Wang, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 16/125,187

(22) Filed: Sep. 7, 2018

(65) Prior Publication Data

US 2019/0096539 A1    Mar. 28, 2019

Related U.S. Application Data

(60) Provisional application No. 62/564,894, filed on Sep. 28, 2017.

(51) Int. Cl.
| | |
|---|---|
| *C25D 11/02* | (2006.01) |
| *H01B 1/08* | (2006.01) |
| *H01B 1/02* | (2006.01) |
| *C23C 14/08* | (2006.01) |
| *C23C 14/54* | (2006.01) |
| *C23C 14/00* | (2006.01) |
| *C23C 14/24* | (2006.01) |
| *C23C 14/02* | (2006.01) |

(52) U.S. Cl.
CPC ........... *H01B 1/08* (2013.01); *C23C 14/0021* (2013.01); *C23C 14/022* (2013.01); *C23C 14/08* (2013.01); *C23C 14/086* (2013.01); *C23C 14/24* (2013.01); *C23C 14/541* (2013.01); *H01B 1/02* (2013.01)

(58) Field of Classification Search
None
See application file for complete search history.

(56) References Cited

U.S. PATENT DOCUMENTS

| | | | |
|---|---|---|---|
| 7,939,363 B1 * | 5/2011 | Johnson | ............... C03C 17/347 136/260 |
| 2010/0200955 A1 * | 8/2010 | Oshima | ................... C30B 25/02 257/615 |
| 2011/0036391 A1 * | 2/2011 | McCormick | ........ G02F 1/13439 136/252 |
| 2011/0277812 A1 * | 11/2011 | Buller | ..................... C23C 14/08 136/244 |

(Continued)

FOREIGN PATENT DOCUMENTS

JP    5-32482 A    2/1993

OTHER PUBLICATIONS

Kim et al., High Mobility in a Stable Transparent Perovskite Oxide, May 22, 2012, Applied Physics Express, vol. 5, 061102 (4 pages). (Year: 2012).*

(Continued)

*Primary Examiner* — Seth Dumbris
*Assistant Examiner* — Kim S. Horger
(74) *Attorney, Agent, or Firm* — Shumaker & Sieffert, P.A.

(57) ABSTRACT

In some examples, the disclosure describes a film including a rare-earth element-doped metal stannate exhibiting an electrical conductivity of at least about $10^4$ S/cm at room temperature, where the metal includes at least one of barium, strontium, calcium, or zinc.

25 Claims, 10 Drawing Sheets

(56) References Cited

U.S. PATENT DOCUMENTS

| | | | | |
|---|---|---|---|---|
| 2015/0048282 | A1* | 2/2015 | Char | H01L 29/24 252/519.1 |
| 2015/0155067 | A1* | 6/2015 | Char | H01L 21/02565 252/519.13 |
| 2015/0372173 | A1* | 12/2015 | Hicks | H01L 31/022466 136/256 |

OTHER PUBLICATIONS

Prakash et al., Wide Bandgap BaSnO3 Films with Room Temperature Conductivity Exceeding 101^4 S cm^-1, May 5, 2017, Nature Communications, vol. 8, 15167 (9 pages) (Year: 2017).*
Shin et al., Colloidally Prepared La-doped BaSnO3 Electrodes for Efficient, Photostable Perovskite Solar Cells, Apr. 14, 2017, Science, vol. 356, p. 167-171 (5 pages). (Year: 2017).*
Schumann et al. "Structure and optical band gaps of (Ba,Sr)SnO3 films grown by molecular beam epitaxy", Sep. 1, 2016, Journal of Vacuum Science & Technology A: Vacuum, Surfaces, and Films, 34(5), p. 050601-1 to 050601-4 (Year: 2016).*
Arezoomandan et al., "Large nanoscale electronic conductivity in complex oxide heterostructures with ultra high electron density," APL Materials vol. 4, No. 7, Jul. 2016, 8 pp.
Chambers et al. "Band alignment at epitaxial BaSnO3/SrTiO3 and BaSnO3/LaAlO3(001) heterojunctions," Applied Physics Letters, vol. 108, Apr. 2016, 4 pp.
Feigl et al., "Structural and transport properties of epitaxial PrNiO3 thin films grown by molecular beam epitaxy,", Journal of Crystal Growth, vol. 366, Mar. 2013, 4 pp.
Ganguly et al., "Structure and transport in high pressure oxygen sputter-deposited BaSnO3-δ," APL Materials, vol. 3, May 2015, 6 pp.
Jacoboni et al., "A Review of Some Charge Transport Properties of Silicon," Solid-State Electronics, vol. 20, No. 2, Feb. 1977, 13 pp.
Jalan et al., "Growth of high-quality SrTiO3 films using a hybrid molecular beam epitaxy approach," Journal of Vacuum Science & Technology A, vol. 27, No. 3, May/Jun. 2009, 4 pp.
Jalan, "MBE Growth, Structure, Defects and Transport in High-Mobility Epitaxial La-doped BaSnO3 Films," Abstract, Apr. 2016, 1 pp.
Jalan, "Perovskite Oxide Thin Films and Heterostructures for High Frequency, High Power, Transparent Electronics," AFRL Talk, May 5, 2017, 87 pp.
Kim et al., "Determination of temperature-dependent thermal conductivity of a BaSnO3-ιsingle crystal by using the 3ω method," Thermochimica Acta, vol. 585, Mar. 2014, 5 pp.
Kim et al., "Physical properties of transparent perovskite oxides (Ba,La) SnO3 with high electrical mobility at room temperature," Physical Review B, vol. 86, Oct. 2012, 31 pp.

Lebens-Higgins et al., "Direct Observation of Electrostatically Driven Band Gap Renormalization in a Degenerate Perovskite Transparent Conducting Oxide," Physical Review Letters, No. 116, Jan. 2016, 5 pp.
Li et al., "Tuning optical properties of transparent conducting barium stannate by dimensional reduction," APL Materials, vol. 3, No. 1, Jan. 2015, 9 pp.
Luo et al., "High carrier mobility in transparent Ba1-xLaxSnO3 crystals with a wide band gap," Applied Physics Letters, vol. 100, No. 17, Apr. 2012, 16 pp.
Martin et al., Advances in the growth and characterization of magnetic, ferroelectric, and multiferroic oxide thin films, Materials Science and Engineering R: Reports, vol. 68, May 2010, 45 pp.
Moreira, et al., "Structural and optoelectronic properties, and infrared spectrum of cubic BaSnO3 from first principles calculations," Journal of Applied Physics, vol. 112, Aug. 2012, 8 pp.
Prakash et al., "Adsorption-controlled growth and the influence of stoichiometry on electronic transport in hybrid molecular beam epitaxy-grown BaSnO3 films," Journal of Materials Chemistry C, vol. 5, No. 23, Feb. 2017, 7 pp.
Prakash et al., "Structure and electronic properties of La-doped BaSnO3 films grown via hybrid MBE," Abstract for poster presented at AVS Symposium, Oct. 2016, 1 pp.
Prakash et al., "Hybrid molecular beam epitaxy for the growth of stoichiometric BaSnO3," Journal of Vacuum Science & Technology A: Vacuum, Surfaces and Films, vol. 33, No. 6, Oct. 2015, 6 pp.
Raghavan et al., "High-mobility BaSnO3 grown by oxide molecular beam epitaxy," APL Materials, vol. 4, No. 1, Jan. 2016, 5 pp.
Singh et. al., Electronic Structure of Ba(Sn,Sb)O3: Absence of superconductivity, Physical Review B, vol. 44, No. 17, Nov. 1991, 5 pp.
Spinelli et al., "Electronic transport in doped SrTiO3: Conduction mechanisms and potential applications," Physical Review B, vol. 81, Apr. 2010, 14 pp.
Stanislavchuk et al., "Electronic band structure and optical phonons of BaSnO3 and Ba0.97La0.03SnO3 single crystals: Theory and experiment," Journal of Applied Physics, vol. 112, Aug. 2012, 7 pp.
Xu et al., "Predictive Control over Charge Density in the Two-Dimensional Electron Gas at the Polar-Nonpolar NdTiO3/SrTiO3 Interface," Physical Review Letters, vol. 117, Sep. 2016, 6 pp.
Xu et al., "Quasi 2D Ultrahigh Carrier Density in a Complex Oxide Broken-Gap Heterojunction," Advanced Materials Interfaces, vol. 3, No. 2, Jan. 2016, 8 pp.
Xu et al., "Stoichiometry-driven metal-to-insulator transition in NdTiO3/SrTiO3 heterostructures," Applied Physics Letters, vol. 104, Feb. 2014, 5 pp.
You et al., "Electron scattering due to threading edge dislocations in n-type wurtzite GaN," Journal of Applied Physics, vol. 99, Feb. 2006, 10 pp.

* cited by examiner

CONDUCTIVE FILMS

The application claims the benefit of U.S. Provisional Application Ser. No. 62/564,894, filed Sep. 28, 2017, the contents of which are incorporated by reference herein in their entirety.

GOVERNMENT INTEREST

This invention was made with government support under DMR-1410888 awarded by National Science Foundation and FA9550-16-1-0205 awarded by Air Force Office of Scientific Research. The government has certain rights in the invention.

TECHNICAL FIELD

The present disclosure relates to conductive films.

BACKGROUND

Conductive films may have a high conductivity at room temperature and may be used in a wide range of applications. For example, conductive films may be used in logic and resistive memory applications, as transparent conducting oxides, and/or as active components in power electronics. To reduce power consumption and enable use in high-frequency applications, conductive films may exhibit a high carrier mobility at room temperature. For some applications, conductive films may need to be thin while still exhibiting a high electrical conductivity and a high carrier mobility at room temperature.

SUMMARY

In some examples, the disclosure describes a film including a rare-earth element-doped metal stannate exhibiting an electrical conductivity of at least about $10^4$ S/cm at room temperature, where the metal includes at least one of barium, strontium, calcium, or zinc.

In some examples, the disclosure describes a method including forming a film including a rare-earth element-doped metal stannate using a vapor phase technique, where the film exhibits an electrical conductivity of at least about $10^4$ S/cm at room temperature, and where the metal includes at least one of barium, strontium, calcium, or zinc.

In some examples, the disclosure describes a multi-layer film including a first layer and a second layer. The first layer includes a rare-earth element-doped metal stannate exhibiting an electrical conductivity of at least about $10^4$ S/cm at room temperature, where the metal includes at least one of barium, strontium, calcium, or zinc.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
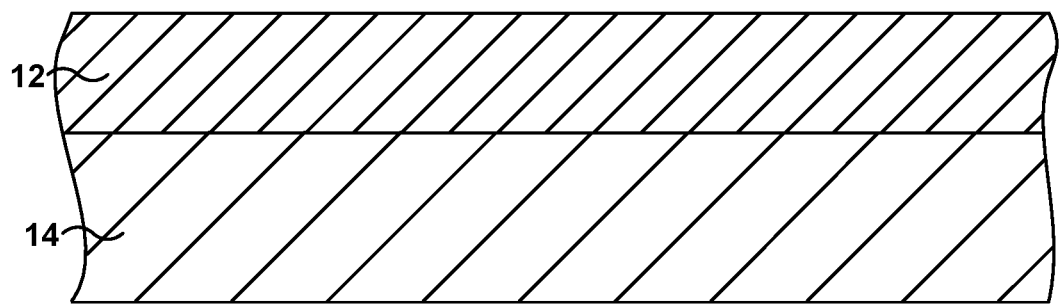
FIG. 1 is a cross-sectional diagram of an example article that includes a film including a rare-earth element-doped metal stannate, where the metal is at least one of Ba, Sr, Ca, or Zn, on a substrate.

This disclosure describes a film including a rare-earth element-doped metal stannate, where the metal is at least one of Ba, Sr, Ca, or Zn, exhibiting an electrical conductivity of at least about $10^4$ S/cm at room temperature and techniques of forming such films. The film may further exhibit a relatively high carrier mobility at room temperature, relatively low sheet resistance at room temperature, relatively high bandgap at room temperature, or combinations thereof.

In some examples, the rare-earth element may include lanthanum, and the metal stannate may include $BaSnO_3$, $SrSn_{O3}$, $CaSnO_3$, or $ZnSnO_3$. The rare-earth element-doped metal stannate, where the metal is at least one of Ba, Sr, Ca, or Zn, may include a concentration of the rare-earth element of at least about $10^{20}$ cm$^{-3}$, such as between about $10^{20}$ cm$^{-3}$ and about $10^{22}$ cm$^{-3}$. Such films may exhibit relatively low sheet resistance, such as less than about 10 Ω/sq at room temperature, may exhibit relatively high carrier mobility, such as at least about 60 cm$^2$/V-s at room temperature, may exhibit a relatively large bandgap, such as about 3 eV at room temperature, may be optically transparent, or combinations thereof. Such properties may allow the films to be used in a variety of applications, such as for logic and/or resistive memory applications, as transparent conducting oxides (TCOs), as active components in power electronics, or the like.

The rare-earth element-doped metal stannate, where the metal is at least one of Ba, Sr, Ca, or Zn, may include a perovskite crystal structure. In some examples, perovskite oxides and/or perovskite oxide heterostructures may be used as conductive films. As used herein, a "perovskite oxide" refers to a compound with a chemical formula of $ABO_3$, where A is a cation coordinated by 12 oxygens and B is a cation coordinated by 6 oxygens, arranged in a ternary oxide structure. In some examples, A may include a metal including at least one of Ba, Sr, Ca, or Zn, and B may include a basic or post-transition metal or a transition metal. For example, a perovskite oxide may include $SrTiO_3$, $BaTiO_3$, $LaTiO_3$, $SrVO_3$, $LaVO_3$, $SrSnO_3$, $BaSnO_3$, $LaAlO_3$, $CaSnO_3$, $ZnSnO_3$, or $LaNiO_3$. As used herein, a "perovskite heterostructure" refers to a structure including a perovskite oxide and at least one other material. For example, a perovskite heterostructure may be a multi-layer film including a layer of $BaSnO_3$ and a layer of $LaAlO_3$ on a $SrTiO_3$ substrate.

Some perovskite oxides and/or perovskite oxide heterostructures may have structural flexibility, a complex defect structure, a complex electronic band structure, or combinations thereof, which may be useful in some electrical applications. In some examples, structural flexibility, a complex defect structure (e.g., a material including multiple types of defects or irregularities in a crystal structure of the material), and a complex electronic band structure (e.g., an electronic band structure that can be generalized to wave vectors that are complex numbers) may result in a material exhibiting a high electrical conductivity and/or a high carrier mobility, such as, for example, an electrical conductivity of at least about 10$^4$ S/cm and/or a carrier mobility of at least about 60 cm$^2$/V-s. However, some perovskite oxides may not exhibit an electrical conductivity and/or carrier mobility at room temperature to be useful in certain electrical applications. For example, a perovskite oxide such as $SrTiO_3$ may exhibit an electrical conductivity of less than about 500 S/cm and a carrier mobility of less than about 10 cm$^2$/V-s at room temperature. In another example, some perovskite oxide heterostructures, such as those including interfaces of $LaAlO_3$/$SrTiO_3$, may be capable of exhibiting a high electrical conductivity and a high carrier mobility, but may exhibit these qualities at temperatures that are less than room temperature. In contrast, the rare-earth element-doped metal stannates, where the metal is at least one of Ba, Sr, Ca, or Zn, described herein may exhibit a relatively high electrical conductivity and/or a relatively high carrier mobility at room temperature.

In some examples described herein, the metal stannates, where the metal is at least one of Ba, Sr, Ca, or Zn, are doped with another element or compound, such as, for example, a rare-earth element. The rare-earth element may include lanthanum (La), lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), yttrium (Y), or scandium (Sc). The doped metal stannates, where the metal is at least one of Ba, Sr, Ca, or Zn, may have the chemical formula of $A_{1-x}RE_xBO_3$, where RE is the rare-earth element.

The rare-earth element-doped metal stannates, where the metal is at least one of Ba, Sr, Ca, or Zn, may exhibit a relatively high electrical conductivity and/or a relatively high carrier mobility at room temperature even in thin film form. In contrast, some other doped perovskite oxides may exhibit a high carrier mobility and a high electrical conductivity at room temperature in bulk form, such as bulk doped-$BaSnO_3$ (BSO), but thin films of doped-BSO may exhibit lower carrier mobilities than the carrier mobilities exhibited by bulk doped-BSO, depending on the technique used to form the doped-BSO thin film. For example, the carrier mobility exhibited by thin films of doped-BSO may be between about 80 cm$^2$/V-s and about 150 cm$^2$/V-s at room temperature. Additionally, or alternatively, depending on the technique used to form the doped-BSO thin film, the electrical conductivity exhibited by thin film doped-BSO may also be lower than that of bulk doped-BSO. For example, the electrical conductivity exhibited by thin-film doped-BSO may be between about 2×10$^3$ S/cm and about 3×10$^3$ S/cm at room temperature, in comparison to some bulk doped-BSO exhibiting an electrical conductivity of about 4×10$^3$ S/cm.

While not wishing to be bound by theory, currently available information may indicate that the difference in carrier mobility exhibited by bulk single crystals and by thin films of doped-BSO may be attributed to substrate-induced misfit and/or threading dislocations. In some examples, dislocations can introduce charged defects leading to charge compensation of carriers, and an overall reduced carrier mobility. For example, threading dislocations may result in charged defect complexes, which may form charge compensating acceptors. The charge compensating acceptors, and in some examples, the presence of space charged regions around dislocations, may result in enhanced electron scattering, and thus reduced carrier mobility.

Additionally, or alternatively, and while not wishing to be bound by theory, currently available information may indicate that a similar effect may result from non-stoichiometry, which may also introduce charged point defects. In some examples, non-stoichiometry may result in doped-BSO films grown via different synthesis routes exhibiting different carrier mobilities at room temperature, despite having similar substrates and doping levels. The films described herein may exhibit a relatively high conductivity and a relatively high carrier mobility at room temperature, and the techniques described herein for forming the film may consistently and reproducibly form films exhibiting such qualities. For example, the thin films described herein may be formed using a vapor phase technique, such as hybrid molecular beam epitaxy, molecular beam epitaxy, sputtering, or pulsed laser deposition. Such vapor phase techniques may allow reproducible formation of rare-earth element-doped metal stannate films, where the metal is at least one of Ba, Sr, Ca, or Zn, such as rare-earth element-doped BSO films, with a relatively high conductivity at room temperature, a relatively high carrier mobility at room temperature, or both.

FIG. 1 is a cross-sectional diagram of an example article 10 that includes a film 12 including a rare-earth element-doped metal stannate, where the metal is at least one of Ba, Sr, Ca, or Zn, on a substrate 14. Substrate 14 may include any material on which film 12 may be formed. In some examples, substrate 14 may include a perovskite oxide. For example, substrate 14 may include strontium titanate (Sr$TiO_3$; STO), lanthanum aluminate (LaAlO$_3$; LAO), or the like. In some examples, a substrate 14 that includes STO may include a (001) surface on which film 12 is formed.

In some examples, the material from which substrate 14 is formed may be selected to have a predetermined lattice mismatch with film 12. For example, the lattice mismatch may be selected to be close to 0, to reduce formation of misfit dislocations and strain relaxation in film 12. In examples in which a lattice mismatch is present between substrate 14 and film 12, the density of misfit dislocations is largest near interface between film 12 and substrate 14, which reduces the carrier mobility and affects defect densities. In examples in which substrate 14 includes STO(001) and film 12 includes BSO, the lattice mismatch between BSO and STO(001) is about −5.12% (compressive).

In some examples, film 12 may include a perovskite oxide, such as, for example, a metal stannate. In some examples, the perovskite oxide may provide the film with a complex defect structure, a wide compositional space, structural flexibility, and/or a complex electronic band structure. In this way, a film including a perovskite oxide may be useful as a component for logic and/or resistive memory, as a transparent conducting oxide, as an active component in power electronics, or the like.

In some examples, the perovskite oxide may include a metal, such as, for example, barium (Ba), strontium (Sr), calcium (Ca), or Zinc (Zn). For example, the perovskite oxide may include Ba. In other examples, the perovskite oxide may include Sr. In some examples, Ba and/or Sr may undergo oxidation more easily than some other metals. In turn, in some examples it may be easier to grow a film including a perovskite oxide including Ba and/or Sr than a film including another perovskite oxide. Additionally, or alternatively, a film including a perovskite oxide including Ba and/or Sr may be more stable than some films including a perovskite oxide including other metals.

The perovskite oxide may further include a second metal, such as, for example, a transition metal or a basic or post-transition metal. For example, the perovskite oxide may include Titanium (Ti), Vanadium (V), Tin (Sn), Nickel (Ni), or Cobalt (Co). In some examples, the perovskite oxide may include Sn. In some examples, Sn may provide the perovskite oxide with a high carrier mobility at room temperature, for example, due to the electronic structure of Sn having a low electron effective mass. In examples in which the metal is Sn, the compound may additionally or alternatively be referred as a stannate or a stannate compound. In examples in which the metal is Ti, the compound may additionally or alternatively be referred as a titanate or a titanate compound. Titanates or titanate compounds may have a higher electron effective mass in comparison to stannates or stannate compounds, and therefore, in some examples, titanates or titanate compounds may have a lower carrier mobility at room temperature than stannates or stannate compounds.

In some examples, film 12 may include $BaSnO_3$ (barium stannate; BSO). In some such examples, BSO may provide film 12 with a simple cubic structure, a band insulator with an indirect bandgap, a Sn 5s-derived conduction band, and/or a high carrier mobility at room temperature. For example, a film 12 including BSO may exhibit a bandgap of about 3 eV and a carrier mobility between about 100 $cm^2$/V-s and about 320 $cm^2$/V-s at room temperature. In some examples, the Sn 5s-dervied conduction band may provide film 12 with a low electron effective mass, resulting in a relatively high carrier mobility at room temperature. Alternatively, or in addition, film 12 may include $SrSnO_3$ (strontium stannate).

Film 12 also includes a dopant. For example, film 12 may include a rare-earth element dopant, such that the perovskite oxide includes a rare-earth element-doped metal stannate, where the metal is at least one of Ba, Sr, Ca, or Zn. In some such examples, film 12 may include a composition of $A_{1-x}RE_xBO_3$, where A is the metal, RE is the rare-earth element, and B is Sn. In some examples, including a dopant may provide film 12 with additional electrons and/or holes, which in turn may result in film 12 exhibiting a relatively high electrical conductivity. Additionally, or alternatively, a dopant including a rare-earth element may have an atomic radius similar to the atomic radius of the metal, such as Ba. The dopant including a rare-earth element having an atomic radius similar to that of the metal, in some examples, may result in film 12 including fewer charged defects. As described above, the rare-earth element may include La, Lu, Yb, Tm, Er, Ho, Dy, Gd, Tb, Eu, Sm, Pm, Nd, Pr, Ce, Y, or Sc. In some examples, the rare-earth element may include La. In some examples, the use of La as a dopant for the film including a rare-earth element-doped metal stannate, where the metal is at least one of Ba, Sr, Ca, or Zn, may have an atomic radius more similar to the atomic radius of the metal than some other rare-earth elements.

Film 12 including a rare-earth element-doped metal stannate, where the metal is at least one of Ba, Sr, Ca, or Zn, may exhibit an electrical conductivity of at least about $10^3$ S/cm at room temperature. For example, film 12 including a rare-earth element-doped metal stannate, where the metal is at least one of Ba, Sr, Ca, or Zn, may exhibit an electrical conductivity of at least about $10^4$ S/cm. In some examples, film 12 may exhibit an electrical conductivity comparable to some transparent conducting oxides that may be used in electrical components, which are often used as metallic electrodes and in electronic applications. In some examples, film 12 including the rare-earth element-doped metal stannate, where the metal is at least one of Ba, Sr, Ca, or Zn, such as a film including La-doped BSO, may exhibit an electrical conductivity that is comparable to some transparent conducting oxides that may be considered an industry standard for transparent conducting oxides, such as, for example, indium tin oxide (ITO). In some examples, film 12 may exhibit a relatively high electrical conductivity without phase segregation. In some examples, film 12 exhibiting a relatively high electrical conductivity without phase segregation may exhibit substantially similar electrical conductivity throughout the volume of film 12.

In some examples, film 12 may exhibit a relatively high carrier mobility at room temperature. For example, film 12 may exhibit a carrier mobility of at least about 60 $cm^2$/V-s at room temperature, or at least about 100 $cm^2$/V-s at room temperature. As used herein, "carrier mobility" characterizes how quickly an electron or a hole can move through a material when influenced by an electric field. In some examples, the carrier mobility may be dependent on the concentration of the rare-earth element dopant and/or temperature. Without wishing to be bound by theory, the dependency of the carrier mobility on the concentration of the rare-earth element dopant and/or temperature may indicate the presence of scattering and/or compensation mechanisms in the material. For example, charged dislocation scattering and/or impurity scattering may affect the carrier mobility. In some examples, film 12 may exhibit a higher carrier mobility at temperatures less than room temperature than the carrier mobility exhibited at room temperature. In some examples, the rare-earth element-doped metal stannate, where the metal is at least one of Ba, Sr, Ca, or Zn, may exhibit a relatively low dislocation density, or the amount of charged dislocations (e.g., charged defects or irregularities in the crystal structure) per area of the film. In some such examples, the carrier mobility in higher in some films that exhibit a lower dislocation density. Forming film 12 using a vapor phase technique, such as molecular beam epitaxy, sputtering, or pulsed laser deposition, may reduce dislocation density in film 12.

In some examples, film 12 including a rare-earth element doped-metal stannate, where the metal is at least one of Ba, Sr, Ca, or Zn, may exhibit a sheet resistance of between about 5 Ω/sq and about 10 Ω/sq at room temperature. As used herein, "sheet resistance" is a measure of the resistance, e.g., how strongly a material opposes the flow of electric current, of films that include a generally uniform thickness, and is inversely related to the electrical conductivity. In this way, a film that exhibits a lower sheet resistance may exhibit a higher electrical conductivity. In some examples, a film exhibiting a sheet resistance of about 10 Ω/sq or less at room temperature may be useful in logic and/or resistive memory, as transparent conducting oxides, as active components in power electronics, or the like.

In some examples, film 12 may include a concentration of the rare-earth element dopant of at least about $10^{20}$ $cm^{-3}$. For example, the concentration of the rare-earth element dopant may be between about $10^{20}$ $cm^{-3}$ and about $10^{22}$ $cm^{-3}$. In some examples, a concentration of the rare-earth element dopant of at least about $10^{20}$ $cm^{-3}$ may result in a film including a rare-earth element doped metal stannate, where the metal is at least one of Ba, Sr, Ca, or Zn, exhibiting a higher carrier mobility than some films with a lower concentration of the rare-earth element dopant.

In some examples, the film including the rare-earth element-doped metal stannate, where the metal is at least one of Ba, Sr, Ca, or Zn, may exhibit a bandgap at least about 2.9 eV, or at least about 3 eV. For example, a film 12 including La-doped BSO may exhibit a bandgap of about 2.91 eV, or about 2.95 eV.

In some examples, film 12 may be optically transparent. In this way, film 12 may be a transparent conducting oxide. In some such examples, film 12 may be used for applications such as solar cells or display technologies. For example, film 12 may be used on a windshield of a vehicle, e.g., to pass current through film 12 and defrost the windshield. In other examples, film 12 may be used as a display, such as, for example, a display of a mobile device, computer, or the like. In other examples, film 12 may be used for additional or alternative applications.

In some examples, the thickness of film 12 may be between about 10 nm and about 10 μm. In other examples, film 12 may have a different thickness. In some examples, the thickness of film 12 may be dependent on the application of the film. For example, a film 12 in a display may have a different thickness than a film 12 used in a logic and/or resistive application.

In some examples, film 12 may be useful in applications such as for logic and/or resistive memory, as transparent conducting oxides, as active components in power electronics, or the like. For example, film 12 may be suitable for use as an electrode material in electronics. Additionally, or alternatively, the high electrical conductivity exhibited by film 12 may be useful in some high-frequency applications. For example, film 12 exhibiting a high electrical conductivity may be useful for high-frequency measurements and devices that may benefit from a component including low resistance contacts, such as, for example, a film including La-doped BSO. In some examples, film 12 may be used in investigating ultra-fast phase dynamics of multiferroics. In some such examples, the use of a film 12 including the rare-earth element-doped metal stannate, where the metal is at least one of Ba, Sr, Ca, or Zn, may provide increased structural compatibility with the multiferroic materials in comparison to some other metals or compounds. Additionally, or alternatively, the relatively high electrical conductivity exhibited by film 12 may allow film 12 to be used in the investigation of ultra-fast phase dynamics of multiferroics and may reduce or prevent a charging effect that may occur with the use of some other materials. In some examples, the ability of the film 12 to accommodate a relatively high density of electrons and exhibit a relatively high carrier mobility, along with exhibiting a relatively wide bandgap, may make film 12 a suitable material for ultra-high-density quantum wells for plasmonic and power electronics applications.

Figure 2:
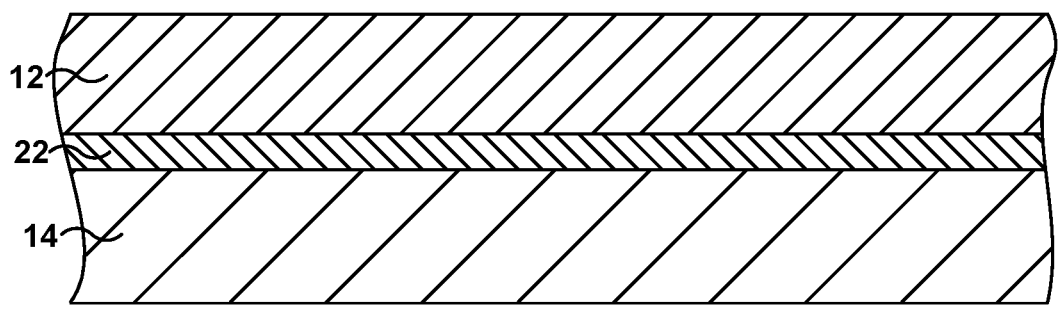
FIG. 2 is a cross-sectional diagram of an example article that includes a film including a rare-earth element-doped metal stannate, where the metal is at least one of Ba, Sr, Ca, or Zn, and a buffer layer on a substrate.

In some examples, a rare-earth element-doped metal stannate, where the metal is at least one of Ba, Sr, Ca, or Zn, may be part of a multilayer film. FIG. 2 is a cross-sectional diagram of an example article 20 that includes a film 12 including a rare-earth element doped metal stannate, where the metal is at least one of Ba, Sr, Ca, or Zn, and a buffer layer 22 on a substrate 14. Substrate 14 and film 12 may be similar to or substantially the same as the corresponding structures from FIG. 1.

Buffer layer 22 is present between substrate 14 and film 12 to, for example, reduce a lattice mismatch between film 12 and the underlying layer. For example, inserting buffer layer 22 between substrate 14 and film 12 may reduce the defect density in film 12. Even with buffer layer 22, in some examples, dislocations may remain present in film 12 as threading dislocations.

In some examples, buffer layer 22 may include the same metal stannate as film 12, but may be left undoped. For example, in an article 10 that includes a film 12 including La-doped BSO, buffer layer 22 may include undoped BSO. In other examples, buffer layer 22 may include a different metal stannate than film 12.

In some examples, buffer layer 22 may define a thickness between about 30 nm and about 250 nm, such as about 125 nm. Buffer layer 22 may be formed using one or more vapor phase techniques, such as such as hybrid molecular beam epitaxy, molecular beam epitaxy, sputtering, or pulsed laser deposition. In some examples, the same vapor phase technique may be used to form buffer layer 22 and film 12.

Figure 3:
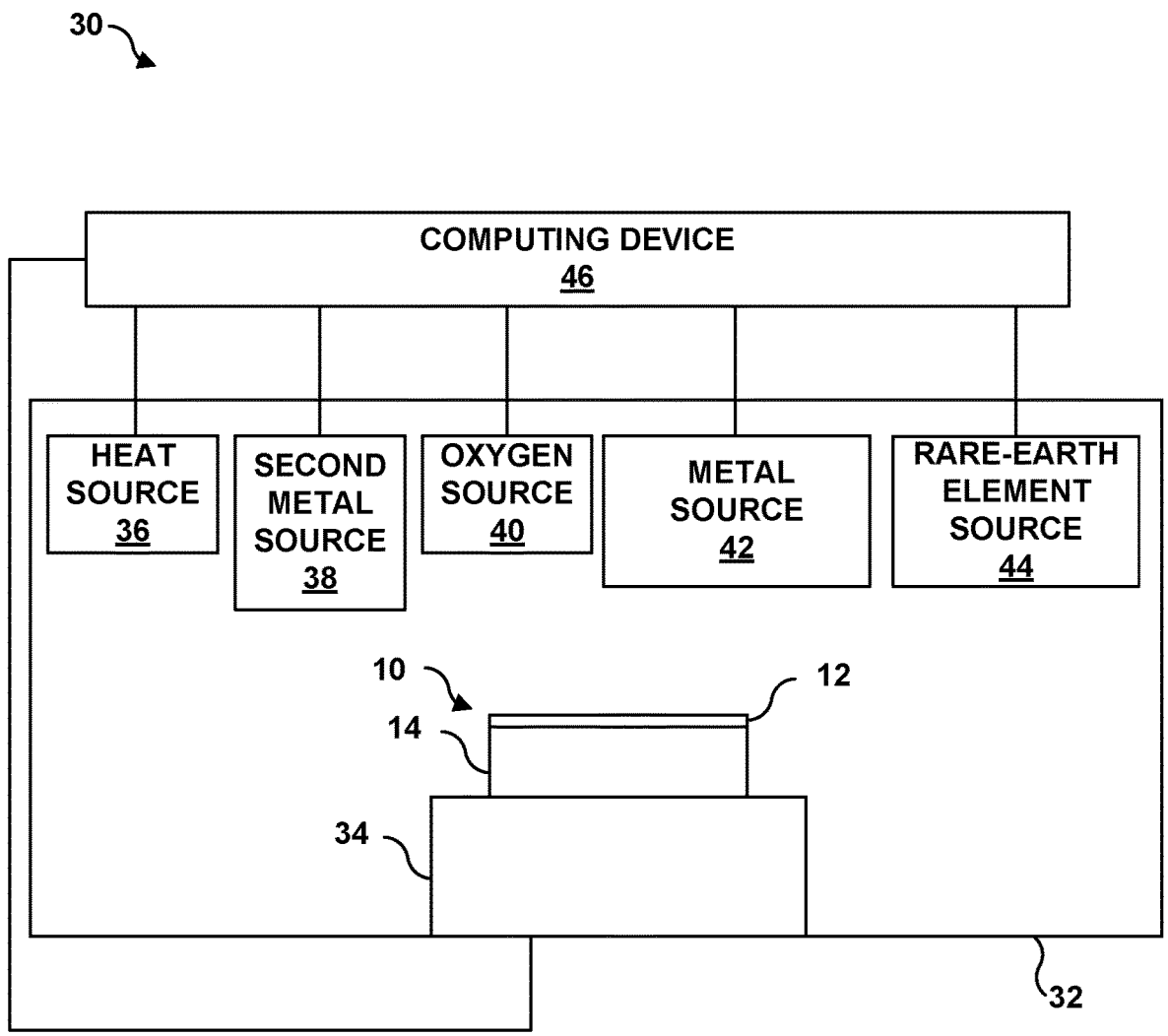
FIG. 3 is a schematic diagram illustrating an example system for forming an article that includes a film including a rare-earth element-doped metal stannate, where the metal is at least one of Ba, Sr, Ca, or Zn, on a substrate using a vapor phase technique.

FIG. 3 is a schematic diagram illustrating an example system 30 for forming an article 10 that includes a film 12 including a rare-earth element-doped metal stannate, where the metal is at least one of Ba, Sr, Ca, or Zn, on a substrate 14 using a vapor phase technique. System 30 includes a computing device 46 and an enclosure 32. System 30 also includes, within enclosure 32, a stage 34, at least one heat source 36, a metal source of at least one of Ba, Sr, Ca, or Zn 42, an oxygen source 40, a second metal source 38, and a rare-earth element source 44.

Computing device 46 may include any one or more of a wide range of devices, including processors (e.g., one or more microprocessors, one or more application specific integrated circuits (ASICs), one or more field programmable gate arrays (FPGAs), or the like), one or more servers, one or more desktop computers, one or more notebook (i.e., laptop) computers, one or more cloud computing clusters, or the like. Computing device 46 may control operation of system 30, including stage 34, at least one heat source 36, and any active components associated with metal source of at least one of Ba, Sr, Ca, or Zn 42, oxygen source 40, second metal source 38, and rare-earth element source 44.

At least one heat source 36 may provide heat for vaporizing one or more of metal source 42, oxygen source 40, second metal source 38, and rare-earth element source 44.

Metal source 42 may include a source of a metal in the perovskite oxide or metal stannate, such as one or more of Ba, Sr, Ca, or Zn. In examples in which system 30 is a molecular beam epitaxy system, metal source 42 may include an effusion cell containing the metal including at least one of Ba, Sr, Ca, or Zn. In some examples, metal source may include at least one of elemental barium, elemental strontium, elemental calcium, elemental zinc, barium oxide, strontium oxide, calcium oxide, or zinc oxide. In other examples, metal source 42 may include a different source of the one or more of Ba, Sr, Ca, or Zn.

Second metal source 38 may include a source of one or more of a basic or post-transition metal or a transition metal (the B in the perovskite formula $ABO_3$). In examples in which system 30 is a molecular beam epitaxy system, second metal source 38 may include an effusion cell containing the one or more basic or post-transition metals or transition metals. The one or more basic or post-transition metals or transition metals may include, for example, Titanium (Ti), Vanadium (V), Tin (Sn), Nickel (Ni), or Cobalt (Co).

In some examples, second metal source 38 may include a metal precursor, such as a metal-organic chemical precursor. For example, second metal source 38 may include hexamethylditin (HMDT), a metal-organic chemical for tin. In some examples, the metal precursor, such as a tin precursor, may convert into a radical upon exposure to at least one of heat or light. A metal-organic chemical precursor may be more reactive than a pure basic or post-transition metal or pure transition metal, which may facilitate oxidation of the basic or post-transition metal or transition metal.

Rare-earth element source 44 may include a source of one or more rare-earth elements, such as lanthanum. In some examples, a concentration of the rare-earth element dopant in film 12 may be controlled by a temperature at which at least one heat source 36 heats rare-earth element source 44. For example, at least one heat source 36 may heat rare-earth element source 44 at a temperature between about 1060° C. and about 1290° C.

Oxygen source 40 may include a source of oxygen for reacting with the basic or post-transition metal or transition metal from second metal source 38 and the metal including at least one of Ba, Sr, Ca, or Zn from metal source 42 to form the perovskite oxide. In some examples, oxygen source 40 may include at least one of oxygen plasma, molecular oxygen, barium oxide, strontium oxide, calcium oxide, or zinc oxide. For example, oxygen source 40 may include source of an oxygen plasma in examples in which system 30 is a molecular beam epitaxy system. In other examples, oxygen source 40 may include a different source of oxygen. In some examples, such as examples in which oxygen source 40 includes oxygen plasma, oxygen source 40 may further include argon.

Figure 4:
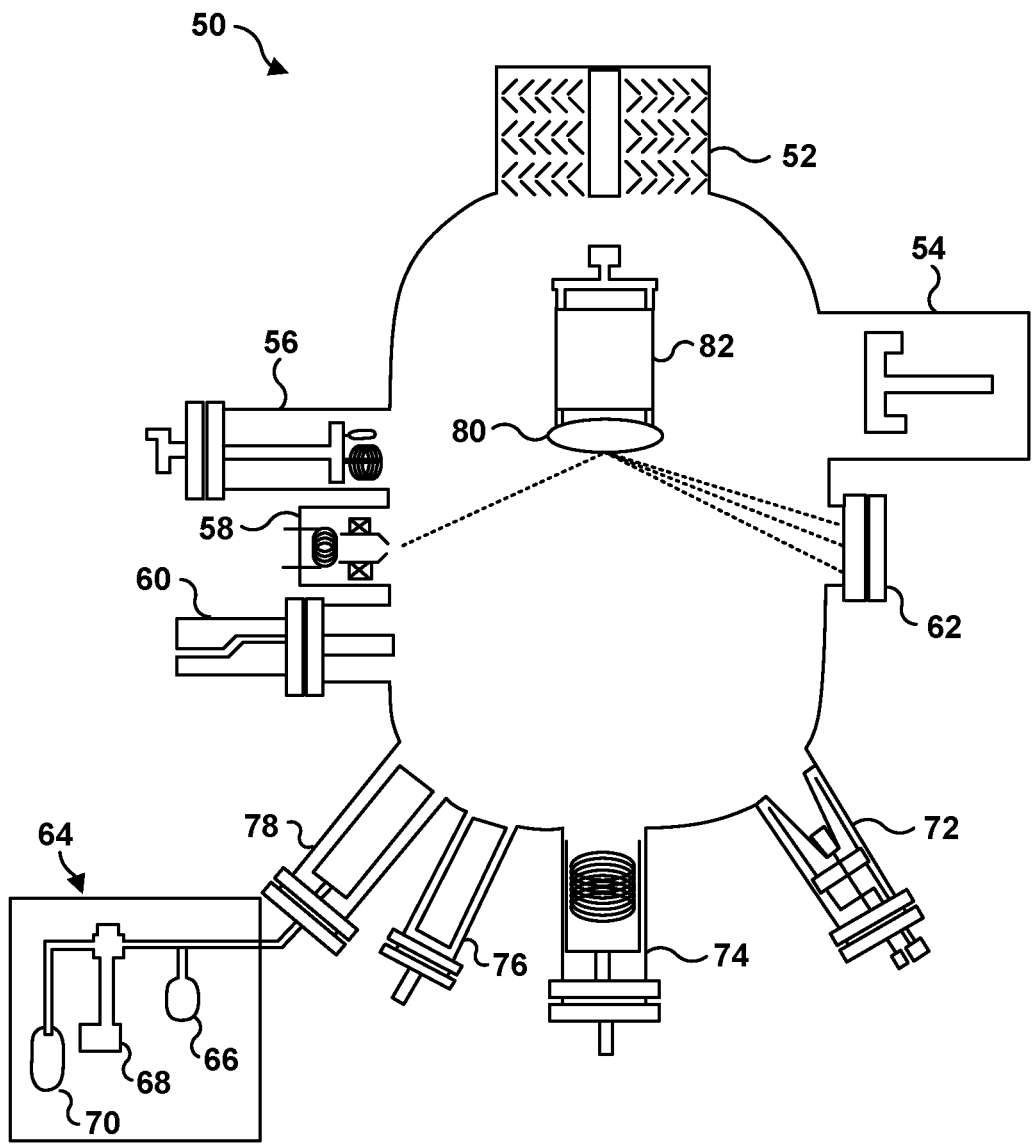
FIG. 4 is a schematic diagram illustrating a specific example system of the example system of FIG. 3 for forming an article that includes a film including a rare-earth element-doped metal stannate, where the metal is at least one of Ba, Sr, Ca, or Zn, on a substrate using a vapor phase technique.

FIG. 4 is a schematic diagram illustrating a specific example system 50 for forming an article that includes a film including a rare-earth element-doped metal stannate, where the metal is at least one of Ba, Sr, Ca, or Zn, on a substrate using a hybrid molecular beam epitaxy technique. System 50 includes a turbomolecular vacuum pump 52, a cryogenic pump 54, an ion gauge 56, a reflection high-energy electron diffraction gun 58 and detector 62, and a residual gas analyzer 60. System 50 also includes a metal effusion cell including at least one of Ba, Sr, Ca, or Zn 72, an oxygen plasma source 74, a rare-earth element source 76, and a second metal source 78. Second metal source 78 may be fluidically coupled to a gas inlet system 64 through which a gaseous basic or post-transition metal or transition metal precursor is introduced to second metal source 78. Gas inlet system 64 may include a bubbler 70, a control valve 68, and a manometer 66. Systems 30 and 50 of FIGS. 3 and 4 may be used to form film 12.

Figure 5:
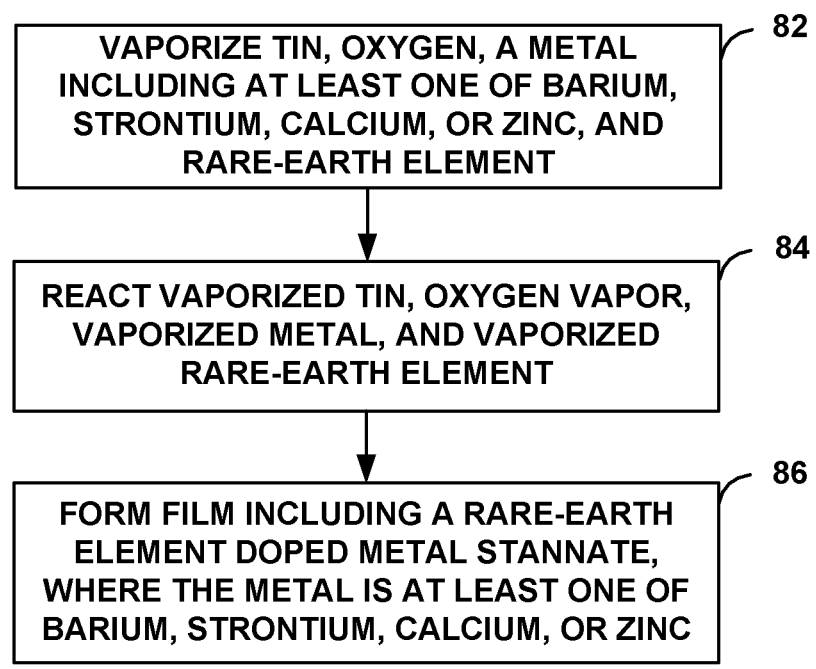
FIG. 5 is a flow diagram illustrating an example technique for forming a film including a rare-earth element-doped metal stannate, where the metal is at least one of Ba, Sr, Ca, or Zn, using a vapor phase technique.

FIG. 5 is a flow diagram illustrating an example technique for forming a film 12 including a rare-earth element-doped metal stannate, where the metal is at least one of Ba, Sr, Ca, or Zn, using a vapor phase technique. The technique includes vaporizing tin, oxygen, a metal including at least one of Ba, Sr, Ca, or Zn, and a rare-earth element (82). As described above, this may be accomplished using a vapor phase technique, such as hybrid molecular beam epitaxy, molecular beam epitaxy, sputtering, or pulsed laser deposition. In some examples utilizing hybrid molecular beam epitaxy, a system similar to system 50 of FIG. 4 may be utilized, and vaporized tin may be from a tin precursor, such as HMDT, which may be provided in gaseous form through second metal source 78. In some examples, the tin precursor may tin precursor convert into a radical upon exposure to at least one of heat or light. The vaporized metal of at least one of Ba, Sr, Ca, or Zn and vaporized rare-earth element may be formed by heating effusion cell of at least one of Ba, Sr, Ca, or Zn 72 and rare-earth element source 76, respectively. The concentration of the rare-earth element dopant in film 12 may be controlled by controlling the temperature at which rare-earth element source 76 is heated. The oxygen may be from oxygen plasma source 74.

The technique of FIG. 5 also includes reacting the vaporized tin, oxygen, metal including at least one of Ba, Sr, Ca, or Zn, and rare-earth element (84) and forming film 12, which includes a rare-earth element doped metal stannate, where the metal is at least one of Ba, Sr, Ca, or Zn (86).

In some examples, the technique of FIG. 5 may enable film 12, or another film as described herein, to be more easily reproduced in comparison to some other techniques. For example, the technique of FIG. 5 may enable films to be grown having the same or similar electronic properties when grown under the same or substantially similar growth conditions. In some examples, the technique of FIG. 5 may also provide the films with better electronic properties in comparison to films grown using different techniques. For instance, films formed using the technique of FIG. 5 may exhibit improved conductivity, carrier mobility, or the like in comparison to similar films formed using a technique other than that of FIG. 5.

This invention was made with XCEL Energy support under contract number RDF Grant Award HE4-3 Block Grant. XCEL energy has certain rights to this invention.

EXAMPLES

The technique of FIG. 5 and the system of FIG. 4 were used to grow films including the rare-earth element-doped metal stannate, where the metal is at least one of Ba, Sr, Ca, or Zn, as described herein, on a substrate. In the following examples, La:BSO (La-doped BSO) films were grown on STO substrates to investigate the properties of the films including the rare-earth element-doped metal stannate, where the metal is at least one of Ba, Sr, Ca, or Zn, as described herein. The La:BSO films were grown via hybrid molecular beam epitaxy (hybrid MBE). Growth conditions were chosen to yield phase substantially pure, epitaxial, and stoichiometric La:BSO films on STO substrates. Hexamethylditin (HMDT) was used as the tin precursor for Sn. Ba and La were evaporated using effusion cells, and the oxygen was supplied using a radio frequency (RF) plasma source. The oxygen pressure and substrate temperature were fixed at 5×10$^{-6}$ Torr and 900° C., respectively, for all film growths. A 350-nm thick Ta layer was deposited on the back of the substrates to improve heat transfer between the film and a substrate heater. Substrates were cleaned in oxygen plasma for 20 minutes prior to film growth to prevent carbon contamination from being present on the surface of the substrate during growth.

Dopant density in the films was controlled by varying the La-cell temperature between about 1060° C. and about 1290° C. The films were annealed in oxygen after growth using a rapid thermal annealer at 800° C. for 2 minutes in order to achieve oxygen stoichiometry. The substrates after film growth and any undoped films were confirmed to be insulating by measuring the resistivity ($\rho>10^5$ Ωcm, where $\rho$ the resistivity). Electron transport measurements were performed in a Quantum Design Physical Property Measurement System (DynaCool™, available from Quantum Design, Inc., San Diego, Calif.) using indium as the ohmic contacts in a van der Pauw geometry. Thermopower measurements were also performed.

The lattice mismatch of the La:BSO film with the STO substrate was found to be compressive at about −5.12%, resulting in the formation of misfit dislocations and strain relaxation for films with thicknesses greater than 1 nm. In some examples, a thick, insulating, and undoped buffer layer between the substrate and the La:BSO films was used in order to reduce the defect density in the La:BSO films grown on the buffer layer. In some examples, threading dislocations remained present in the La:BSO films even with the buffer layer due to the lattice mismatch between the La:BSO film and the substrate. In some examples, there may be two threading dislocations that extend from each misfit location to form a loop-type dislocation shape.

Figure 6A:
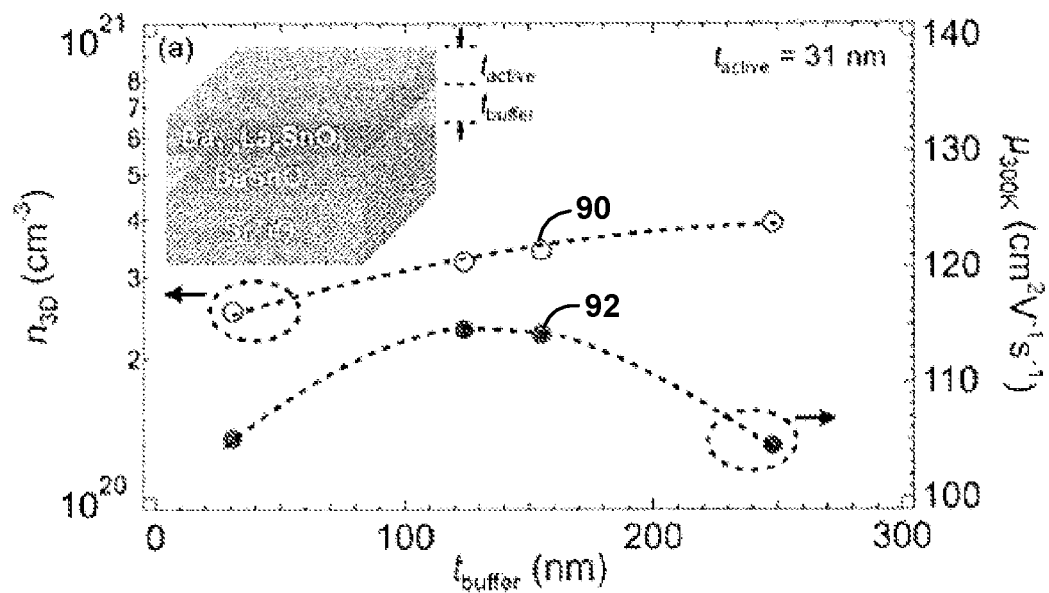
FIG. 6A shows the room temperature carrier concentration ($n_{3D}$) as a function of the thickness of the buffer layer, $t_{buffer}$, and room temperature carrier mobility ($\mu_{300K}$) as a function of the thickness of the buffer layer, $t_{buffer}$, for example La-doped barium stannate films.

A series of La:BSO/BSO buffer/STO films, as illustrated in the inset of FIG. 6A, were grown to investigate the role of dislocations on the electronic transport of the films. The thickness of the La:BSO was kept constant at 31 nm ($t_{active}$), while the thickness of the BSO buffer layer ($t_{buffer}$) was varied between about 30 nm and about 250 nm. Dopant density in the La:BSO layer was kept constant by fixing the La-cell temperature ($T_{La}$) at about 1230° C. FIG. 6A shows the room temperature carrier concentration ($n_{3D}$) as a function of $t_{buffer}$ (90) and room temperature carrier mobility ($\mu_{300K}$) as a function of $t_{buffer}$ (92). As seen in FIG. 6A, $n_{3D}$ increases monotonically between about 2.5×10$^{20}$ cm$^{-3}$ and about 4×10$^{20}$ cm$^{-3}$ (90), whereas $\mu_{300K}$ first increases to about 115 cm$^2$/V-s at $t_{buffer}$=124 nm and then decreases (92). The finding that $n_{3D}$ increases with increasing $t_{buffer}$ (90), which in turn decreases the dislocation density in the La:BSO layer, may suggest that charge compensation is operative, and that threading dislocations may act as acceptor-like defects. The decrease in $\mu_{300K}$ for $t_{buffer}$>124 nm (92) may be due to scattering from increased surface roughness. Similar to misfit dislocations, surface roughness may result in dangling bonds with different electron energy levels than that of the bulk of the film, which may result in scattering and therefore may affect $\mu_{300K}$.

Figure 6B:
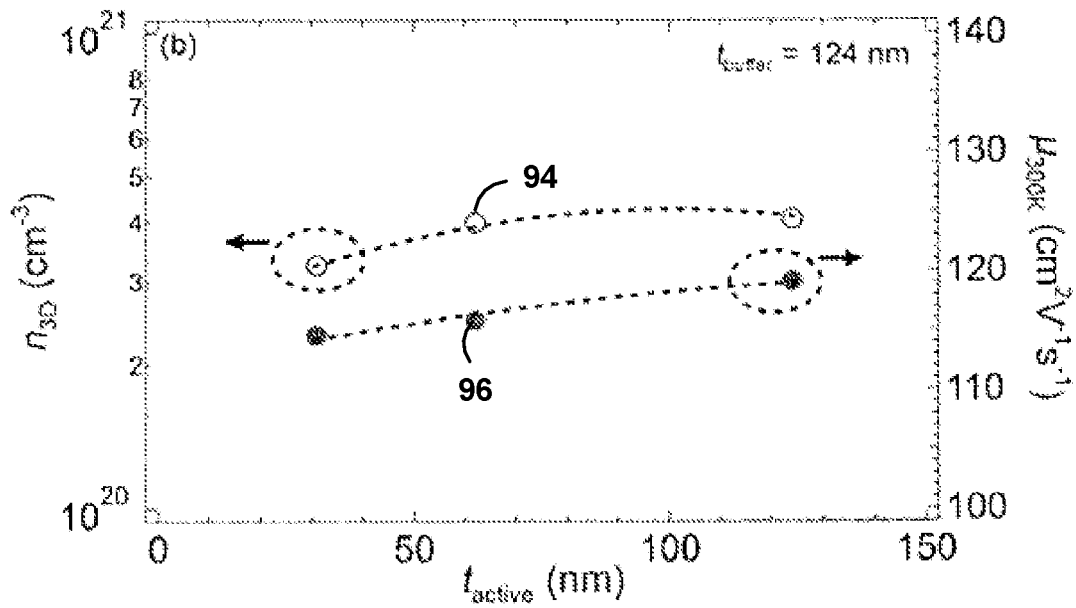
FIG. 6B shows the room temperature carrier concentration, $n_{3D}$, and room temperature carrier mobility, $\mu_{300K}$, as functions of the thickness of a film, $t_{active}$, for example La-doped barium stannate films.

A similar study was performed, only with $t_{buffer}$ kept constant at 124 nm, while the thickness of the La:BSO layer ($t_{active}$) was varied between about 30 nm and about 125 nm. The dopant density was kept constant at $T_{La}$=1230° C. FIG. 6B shows $n_{3D}$ (94) and $\mu_{300K}$ (96) as functions of $t_{active}$. As seen in FIG. 6B, no significant change in $n_{3D}$ (94) or $\mu_{300K}$ (96) was observed. This may indicate that there is no surface depletion effect and/or enhanced scattering at the BSO buffer/La:BSO interface. In other words, the La:BSO may be spatially uniform from an electron transport point of view. Unless otherwise stated, a $t_{buffer}$=124 nm and a $t_{active}$=124 nm were used in the following examples.

Figure 7A:
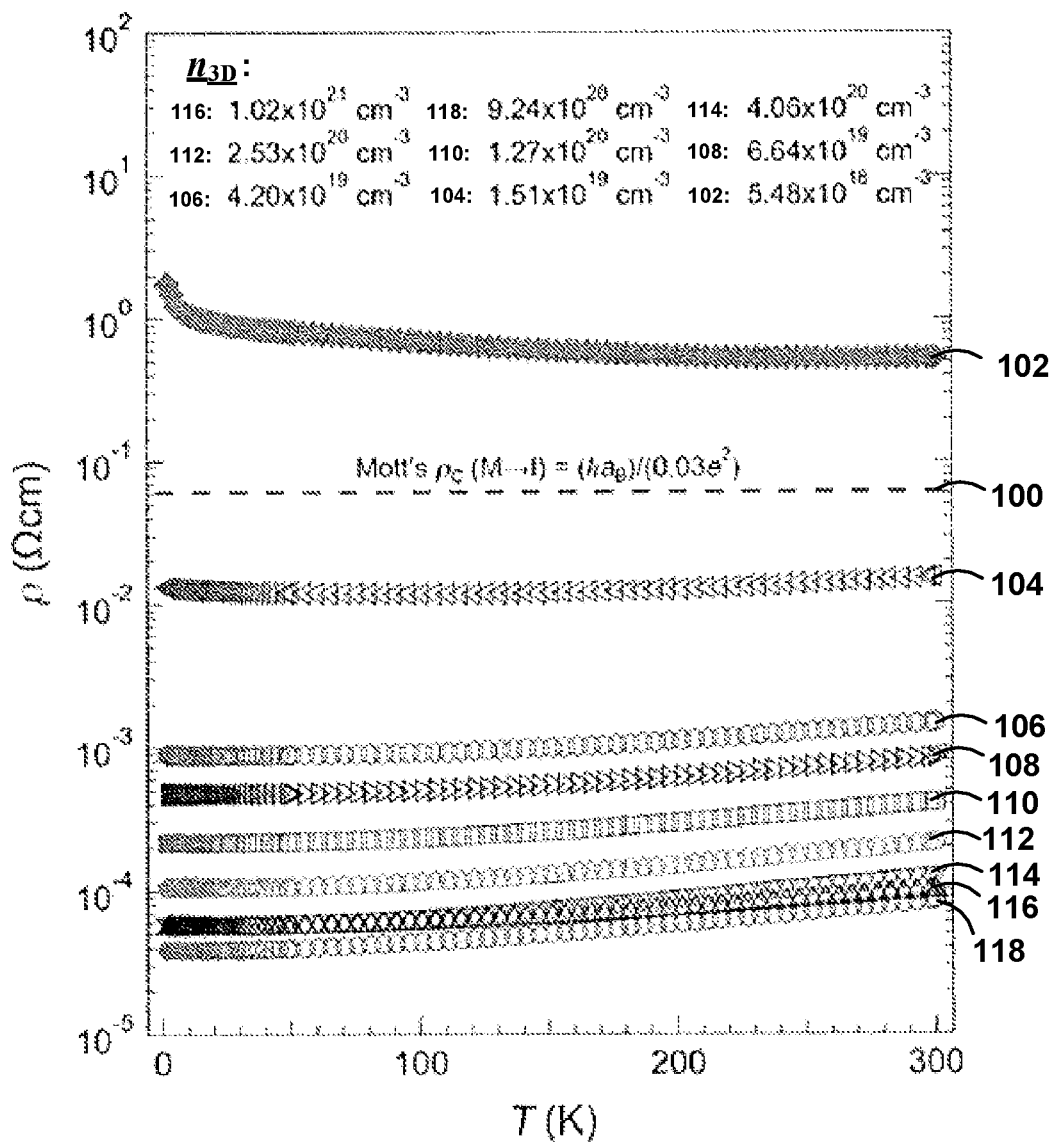
FIG. 7A shows the resistivity ($\rho$) vs. temperature (T) as a function of carrier concentration, $n_{3D}$, for example La-doped barium stannate films.

The effect of charge compensation on electronic transport due to dislocations was investigated using a series of La:BSO/BSO buffer/STO substrate heterostructures. The stoichiometry (e.g., the value of x in Ba$_{1-x}$La$_x$SnO$_3$), and thereby $n_{3D}$ was controlled by varying $T_{La}$ at a fixed Ba/Sn beam equivalent pressure (BEP) ratio. The oxygen flux was also kept fixed. FIG. 7A shows the resistivity ($\rho$) vs. T as a function of $n_{3D}$. Values of $n_{3D}$ investigated were 5.48×10$^{18}$ cm$^{-3}$ (102), 1.51×10$^{19}$ cm$^{-3}$ (104), 4.20×10$^{19}$ cm$^{-3}$ (106), 6.64×10$^{19}$ cm$^{-3}$ (108), 1.27×10$^{20}$ cm$^3$ M (110), 2.53×10$^{20}$ cm$^{-3}$ (112), 4.06×10$^{20}$ cm$^{-3}$ (114), 9.24×10$^{20}$ cm$^{-3}$ (116), and 1.02×10$^{21}$ cm$^{-3}$ (118). The dashed line (100) in FIG. 7A at 0.06 Ω-cm corresponds to the calculated values of $\rho$ for the metal-to-insulator transition based on Mott's minimum metallic conductivity ($\sigma_{min}$) criterion for a degenerately doped semiconductor. As used herein, a "degenerate semiconductor" or a "degenerately doped semiconductor" may include a high level of doping such that the film begins exhibit properties closer to those of a metal than to those of a semiconductor. $\sigma_{min}$ was calculated using Equation 1 below, where $a_B$ is the Bohr radius with its value between about 2.5×10$^{-7}$ cm and about 5.0×10$^{-7}$ cm for La:BSO, assuming an effective mass (m*) of about 0.2 m$_e$ to about 0.4 m$_e$, and a dielectric constant of 20, $\hbar$ is the Dirac constant, and e is the charge of an electron.

$$\sigma_{min} = (0.03)\left(\frac{e^2}{\hbar a_B}\right) \quad (1)$$

As seen in FIG. 7A, a small upturn in $\rho(T)$ was observed at low temperatures. The small upturn may be attributed to weakly localized transport. As seen in FIG. 7A, $\rho(T)$ increases with decreasing $n_{3D}$, leading to a metal-to-insulator transition when $n_{3D}$ is between about 5.48×10$^{18}$ cm$^{-3}$ and about 1.51×10$^{19}$ cm$^{-3}$. The theoretical critical carrier density ($n_C$) for the Mott's metal-to-insulator transition in an uncompensated, degenerately doped semiconductor can be calculated using Equation 2 below.

$$n_C = \left(\frac{0.26}{a_B}\right)^3 \quad (2)$$

Using Equation 2, $n_C$ for the metal-to-insulator transition was found to be between about 1×10$^{17}$ cm$^{-3}$ and about 1.0×10$^{18}$ cm$^{-3}$, which is an order of magnitude smaller than the experimental value determined. This result may suggest the existence of charge compensation that is in agreement with the presence of charged dislocations.

Figure 7B:
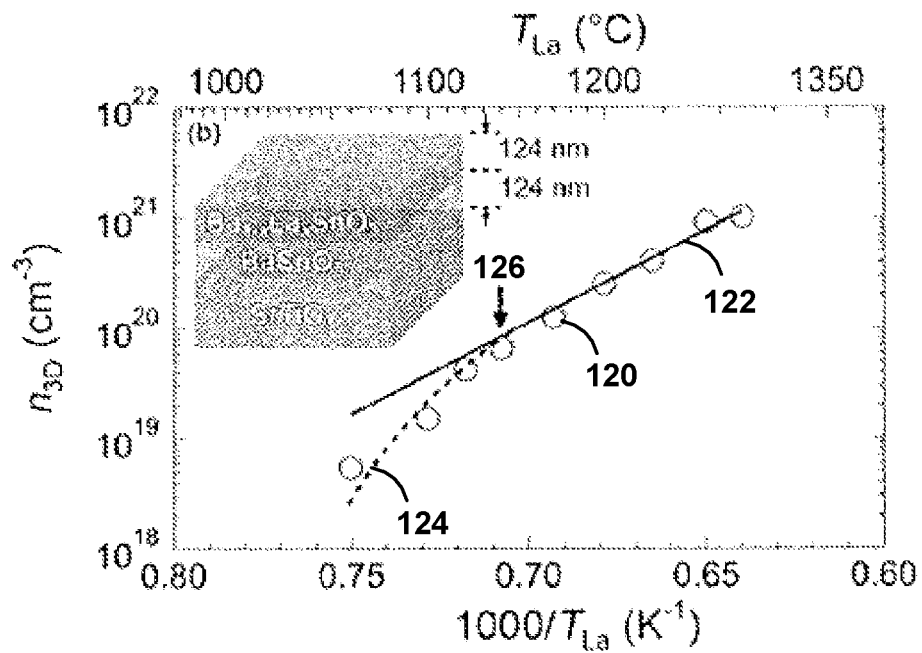
FIG. 7B shows a semi-log plot of room temperature carrier concentration, $n_{3D}$, as a function of the inverse of $T_{La}$, a proxy for La dopant concentration, for example La-doped barium stannate films.

The influence of charge compensation on $n_{3D}$ and $\mu_{300K}$ was also studied. FIG. 7B shows a semi-log plot of room temperature $n_{3D}$ as a function of the inverse of $T_{La}$ (120). $1/T_{La}$ is directly related to the dopant density ($N_{dopant}$) as $N_{dopant} \propto e^{-\Delta/k_B T_{La}}$, where $\Delta$ and $k_B$ are the activation energy of the evaporation of La and the Boltzmann constant, respectively. For low $1/T_{La}$ (high $N_{dopant}$), $n_{3D}$ first decreases linearly on a logarithmic scale with increasing $1/T_{La}$ (122). This result may be expected if La is the source of electrons and is fully-activated. For high $1/T_{La}$ (low $N_{dopant}$), $n_{3D}$ decreases faster, e.g., deviates from linearity (124). This may indicate that electrons are being trapped at the charged dislocations present in the film, resulting in a lower carrier concentration. In some examples, the charge compensation may be operative below an $n_{3D}$ of $6.64 \times 10^{19}$ cm$^{-3}$ (126).

Figure 7C:
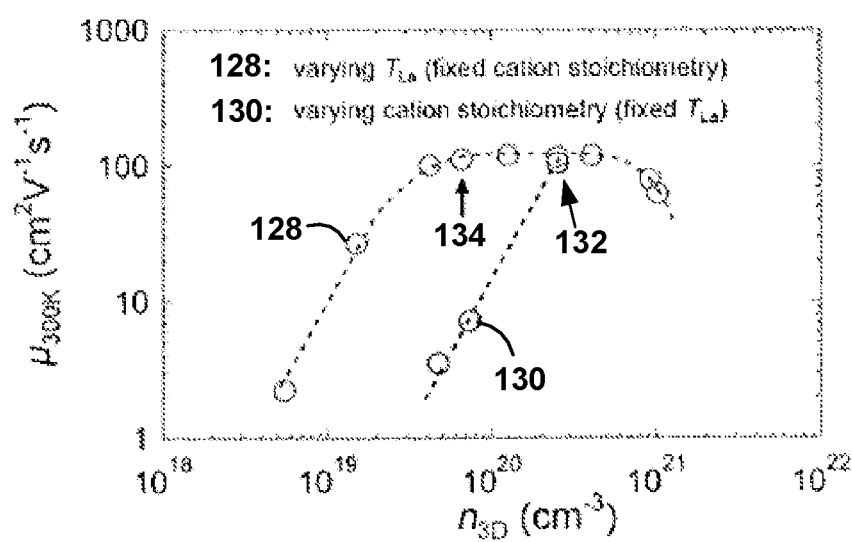
FIG. 7C shows room temperature carrier mobility, $\mu_{300K}$, vs. room temperature carrier concentration, $n_{3D}$, for two series of samples: doped $Ba_{1-x}La_xSnO_3$ with a fixed cation stoichiometry but different x and doped $Ba_{1-x-y}L_xSnO_3$ with a fixed x but different y≥0, for example La-doped barium stannate films.

FIG. 7C shows $\mu_{300K}$ vs. $n_{3D}$ for two series of samples: doped $Ba_{1-x}La_xSnO_3$ with a fixed cation stoichiometry but different x (128) and doped $Ba_{1-x-y}La_xSnO_3$ with a fixed x but different y≥0 (130). y=0 corresponds to the cation stoichiometric composition with $n_{3D}$=$2.53 \times 10^{20}$ and $\mu_{300K}$=115 cm$^2$/V-s (132). The value of y, and thereby the Ba vacancies ($V''_{Ba}$), was controlled by varying the Ba/Sn BEP at a fixed Ba BEP.

For the first series of samples (128), a decreasing carrier density was observed from $n_{3D}$ of about $4 \times 10^{20}$ cm$^{-3}$ to about $1 \times 10^{21}$ cm$^{-3}$. The carrier mobility first increases, then remains substantially unchanged between $n_{3D}$ of about $6.64 \times 10^{19}$ and about $4.06 \times 10^{20}$ cm$^{-3}$ followed by a steeper decrease at $n_{3D} \leq 6.64 \times 10^{19}$ cm$^{-3}$ (134). The carrier density at which $\mu_{300K}$ begins to decrease is the same carrier density at which non-linearity occurs and the charge compensation begins as illustrated in FIG. 7B (126). This may indicate that the decrease in carrier mobility for low $n_{3D}$ is due to scattering and charge compensation from charged defects from dislocations in the film.

For the second series of samples (130), a reduction of $n_{3D}$ resulted in a decrease in the carrier mobility. In other words, increasing $V''_{Ba}$ resulted in a decrease in carrier mobility. This result was found to be in agreement with the theoretical prediction that the Ba-vacancies may be similar to an acceptor-like defect. Further, the functional dependence of $\mu_{300K}$ vs. $n_{3D}$ was found to be similar for both series (128, 130) in the low doping regime. This result may also suggest that dislocation cores in nominally stoichiometric films may consist of Ba-vacancies. A dislocation core may be present due to a misfit dislocation and/or a threading dislocation in the film or layer of the film.

Figure 8A:
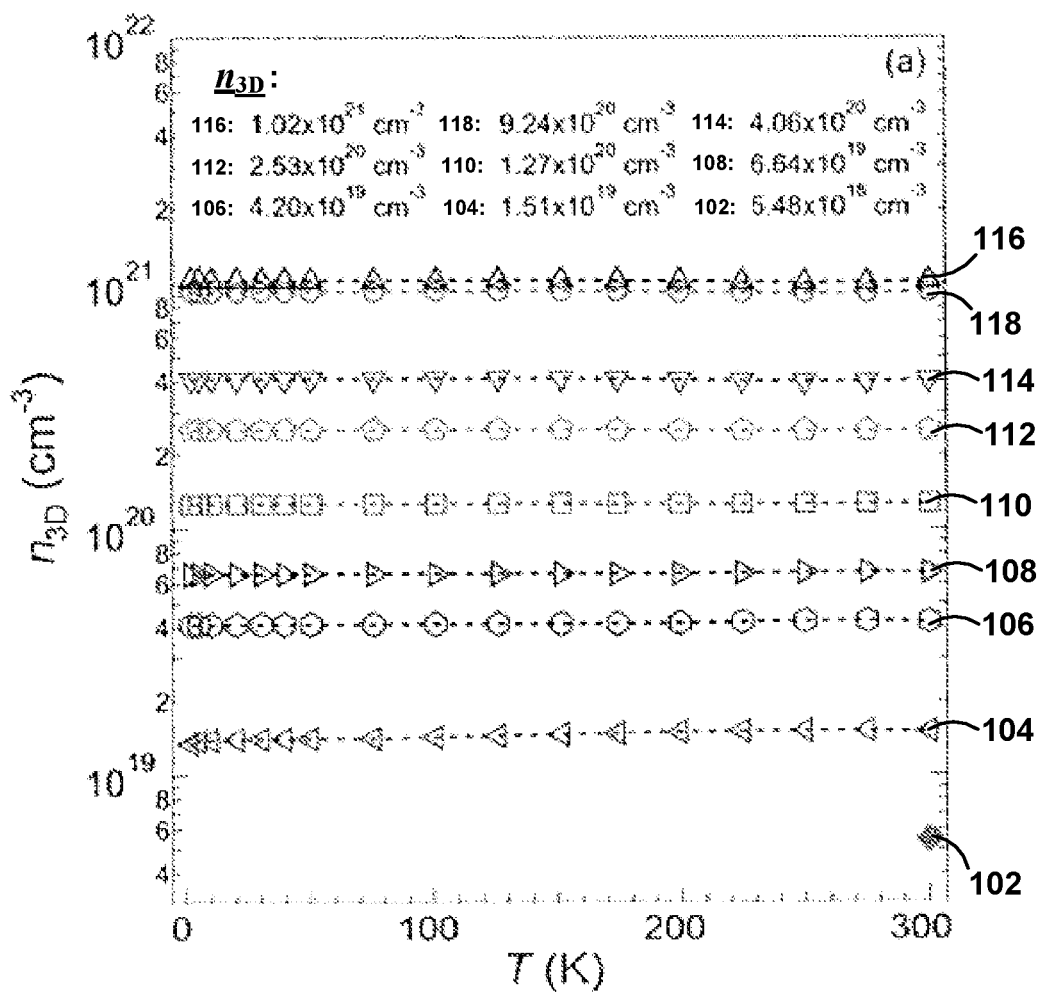
FIGS. 8A and 8B show the temperature dependence of carrier concentration, $n_{3D}$, and carrier mobility, $\mu$, respectively, for different dopant concentrations, for example La-doped barium stannate films.
Figure 8B:
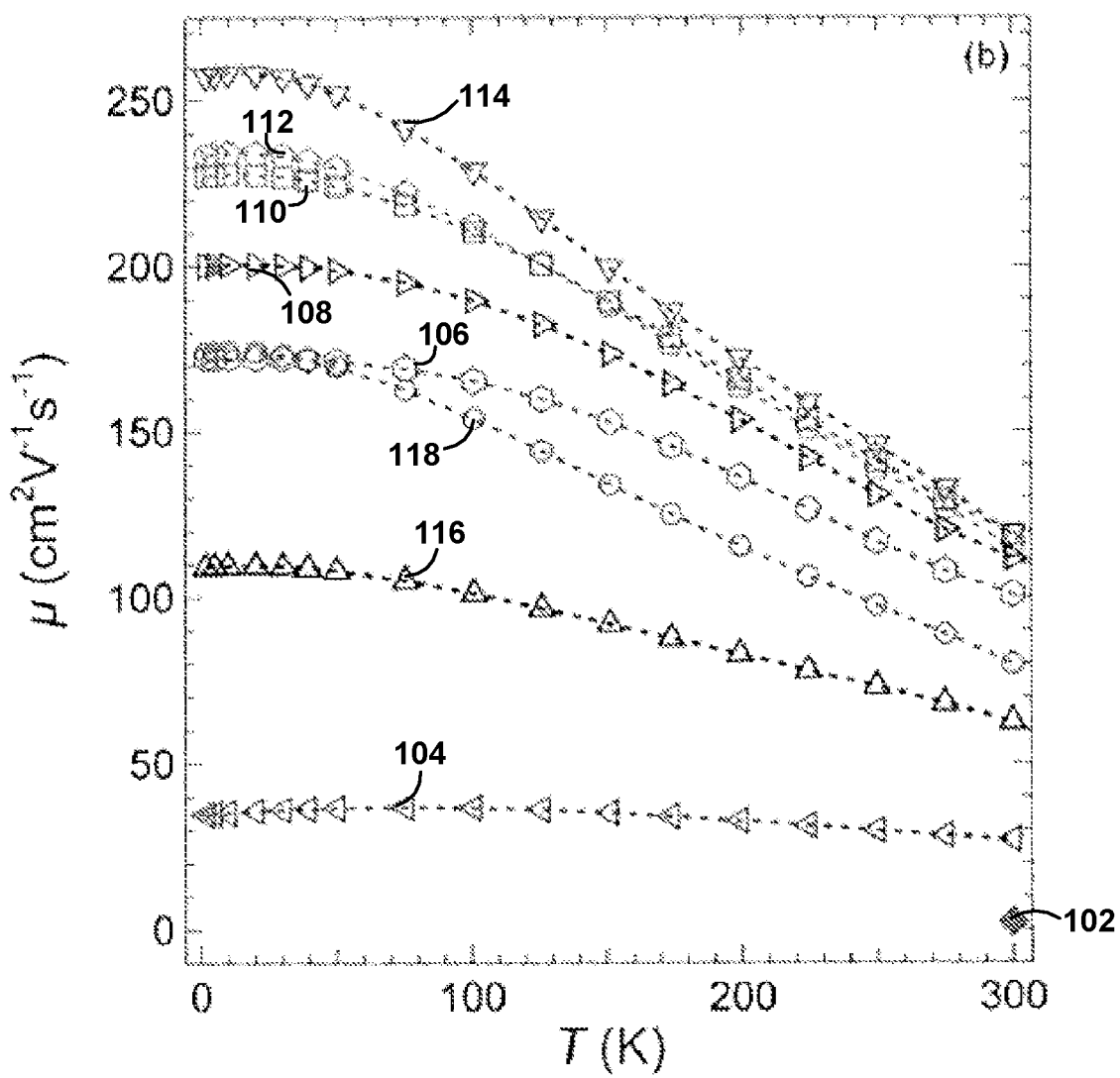

To study electron transport in La:BSO films, the temperature dependence of $n_{3D}$ (FIG. 8A) and $\mu$ (FIG. 8B) were measured for different dopant concentrations. The values of $n_{3D}$ investigated were $5.48 \times 10^{18}$ cm$^{-3}$ (102), $1.51 \times 10^{19}$ cm$^{-3}$ (104), $4.20 \times 10^{19}$ cm$^{-3}$ (106), $6.64 \times 10^{19}$ cm$^{-3}$ (108), $1.27 \times 10^{20}$ cm$^{-3}$ (110), $2.53 \times 10^{20}$ cm$^{-3}$ (112), $4.06 \times 10^{20}$ cm$^{-3}$ (114), $9.24 \times 10^{20}$ cm$^{-3}$ (116), and $1.02 \times 10^{21}$ cm$^{-3}$ (118). As shown in FIG. 8A, no carrier freeze-out was found for temperatures greater than about 2 K for all measured electron concentrations. As used herein, "carrier freeze-out" describes a condition of the films in which not all of the dopants are ionized, and therefore not all of the dopants can donate electrons for transport. This may indicate that La:BSO forms a degenerate semiconductor. As shown in FIG. 8B, a strong temperature dependence of $\mu$ was observed for all of the films, which may indicate that there are different scattering mechanisms present in the films having different dopant concentrations. It should be noted that no temperature dependence of the samples with an $n_{3D}$ of $5.48 \times 10^{18}$ cm$^{-3}$ (102) is shown in FIG. 8A or 8B due to the non-ohmic contacts at T<300 K.

Figure 9:
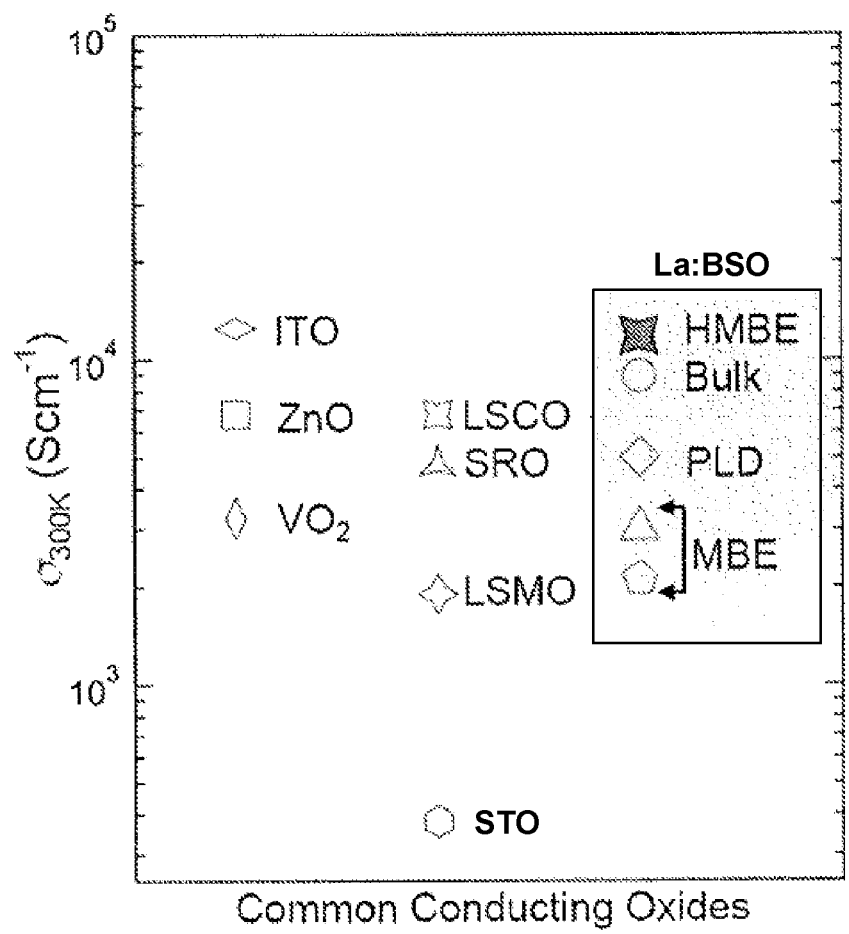
FIG. 9 shows the highest reported values of room temperature electrical conductivity σ (300K) for different oxides, which are often used as metallic electrodes and transparent conducting oxides in electronic applications.

FIG. 9 shows the highest reported values of room temperature conductivity σ (300K) for different oxides, some of which are often used as metallic electrodes and TCOs in electronic applications. The oxides shown are indium tin oxide (ITO), zinc oxide (ZnO), vanadium (IV) oxide (VO$_2$), La$_{0.5}$Sr$_{0.5}$CoO$_3$ (LSCO), SrTiO$_3$ (STO), La$_{0.7}$Sr$_{0.3}$MnO$_3$ (LMSO), and SrRuO$_3$ (SRO). The highest value of σ(300K) of bulk La:BSO single crystals and thin films of La:BSO grown using different techniques (hybrid molecular beam epitaxy (HMBE), pulsed laser deposition (PLD), and molecular beam epitaxy (MBE)) are also shown. The La:BSO film grown using HMBE, e.g., the technique of FIG. 5 using the system of FIG. 4, exhibited a higher conductivity than the conductivity exhibited by both the bulk La:BSO crystal and La:BSO films grown using other techniques. The La:BSO film grown using HMBE, also exhibited a higher electrical conductivity comparable to the electrical conductivity exhibited by ITO, which may be considered an industry standard for TCOs in some examples.

Various examples have been described. These and other examples are within the scope of the following claims.

What is claimed is:

1. A film comprising:
   a rare-earth element-doped metal stannate layer exhibiting an electrical resistivity of less than $10^{-4}$ Ω*cm at 300 K, wherein the metal comprises at least one of barium, strontium, calcium, or zinc, and wherein the rare-earth element-doped metal stannate layer was formed using vapor phase technique and defines a thickness between about 10 nm and about 10 μm.

2. The film of claim 1, wherein the rare-earth element comprises lanthanum.

3. The film of claim 1, wherein the metal stannate comprises BaSnO$_3$ or SrSnO$_3$.

4. The film of claim 1, wherein the rare-earth element-doped metal stannate comprises a concentration of the rare-earth element of at least $10^{20}$ cm$^{-3}$.

5. The film of claim 1, wherein the film exhibits a sheet resistance of between 5 Ω/sq and 10 Ω/sq at 300 K.

6. The film of claim 1, wherein the film exhibits a carrier mobility of at least 60 cm$^2$/V-s at 300 K.

7. The film of claim 1, wherein the film exhibits a bandgap of at least 3 eV at 300 K.

8. The film of claim 1, wherein the film is optically transparent.

9. A method comprising:
   forming a film comprising a rare-earth element-doped metal stannate layer using a vapor phase technique, wherein the film exhibits an electrical resistivity of less than $10^{-4}$ Ω*cm at 300 K, wherein the rare-earth element-doped metal stannate layer defines a thickness between about 10 nm and about 10 μm, and wherein the metal comprises at least one of barium, strontium, calcium, or zinc.

10. The method of claim 9, wherein the vapor phase technique comprises at least one of hybrid molecular beam epitaxy, molecular beam epitaxy, sputtering, or pulsed laser deposition.

11. The method of claim 9, wherein forming the film using a vapor phase technique comprises:
    reacting vaporized tin from a tin source, oxygen vapor from an oxygen source, a vaporized metal including at least one of barium, strontium, calcium, or zinc from a metal source, and a vaporized rare-earth element from a rare-earth element source to form the film.

12. The method of claim 11, wherein the tin source comprises hexamethylditin (HMDT).

13. The method of claim 11, wherein the oxygen source comprises at least one of oxygen plasma, molecular oxygen, barium oxide, strontium oxide, calcium oxide, or zinc oxide.

14. The method of claim 11, wherein the metal source comprises at least one of elemental barium, elemental strontium, elemental calcium, elemental zinc, barium oxide, strontium oxide, calcium oxide, or zinc oxide.

15. A multi-layer film comprising:
a first layer, wherein the first layer comprises a rare-earth element-doped first metal stannate exhibiting an electrical resistivity of less than $10^{-4}$ Ω*cm at 300 K, wherein the first metal comprises at least one of barium, strontium, calcium, or zinc, wherein the first layer defines a thickness between about 10 nm and about 10 μm, and wherein the first layer was formed using vapor phase technique; and
a second layer comprising a second metal stannate, wherein the second metal comprises at least one of barium, strontium, calcium, or zinc.

16. The multi-layer film of claim 15, wherein the rare-earth element comprises lanthanum and the first metal stannate comprises $BaSnO_3$.

17. The multi-layer film of claim 15, wherein the second metal stannate comprises $SrSnO_3$.

18. The multi-layer film of claim 15, further comprising a buffer layer between the rare-earth element doped first metal stannate and the second metal stannate, wherein the buffer layer comprises a third metal stannate, wherein the third metal comprises at least one of barium, strontium, calcium, or zinc, and wherein the third metal stannate is different than the second metal stannate.

19. The multi-layer film of claim 18, wherein the third metal stannate comprises $BaSnO_3$.

20. The multi-layer film of claim 15, wherein the first layer exhibits a sheet resistance of between 5 Ω/sq and 10 Ω/sq at room temperature.

21. The multi-layer film of claim 15, wherein the first layer exhibits a carrier mobility of at least 60 cm$^2$/V-s at room temperature.

22. The multi-layer film of claim 15, wherein the first layer exhibits a bandgap of at least 3 eV at room temperature.

23. The film of claim 1, wherein the rare-earth element-doped metal stannate comprises a concentration of the rare-earth element of greater than or equal to $9.24 \times 10^{20}$ cm$^{-3}$.

24. The film of claim 1, wherein the rare-earth element-doped metal stannate exhibits an electrical resistivity of less than or equal to $8 \times 10^{-5}$ Ω*cm.

25. The film of claim 1, wherein the vapor phase technique comprises hybrid molecular beam epitaxy.

* * * * *